US008961755B2

(12) United States Patent
Yoshioka et al.

(10) Patent No.: US 8,961,755 B2
(45) Date of Patent: Feb. 24, 2015

(54) SEMICONDUCTOR WAFER HOLDER AND ELECTROPLATING SYSTEM FOR PLATING A SEMICONDUCTOR WAFER

(75) Inventors: Junichiro Yoshioka, Kanagawa (JP); Yoshitaka Mukaiyama, Kanagawa (JP)

(73) Assignee: Ebara Corporation, Tokyo (JP)

( * ) Notice: Subject to any disclaimer, the term of this patent is extended or adjusted under 35 U.S.C. 154(b) by 75 days.

(21) Appl. No.: 13/290,243

(22) Filed: Nov. 7, 2011

(65) Prior Publication Data

US 2012/0048727 A1 Mar. 1, 2012

Related U.S. Application Data

(60) Division of application No. 12/903,337, filed on Oct. 13, 2010, now Pat. No. 8,075,756, which is a division of application No. 11/373,103, filed on Mar. 13, 2006, now Pat. No. 7,833,393, which is a division of application No. 09/990,387, filed on Nov. 23, 2001, now Pat. No. 7,022,211, which is a continuation of application No. 09/463,698, filed as application No. PCT/JP99/02576 on May 18, 1999, now abandoned.

(51) Int. Cl.
C25D 17/00 (2006.01)
H01L 21/687 (2006.01)
C25D 17/06 (2006.01)

(52) U.S. Cl.
CPC .......... H01L 21/68721 (2013.01); C25D 17/06 (2013.01); C25D 17/001 (2013.01)
USPC .................. 204/297.01; 204/198; 204/297.06

(58) Field of Classification Search
USPC ........................................................ 204/198
See application file for complete search history.

(56) References Cited

U.S. PATENT DOCUMENTS

| 2,341,712 | A | 2/1944 | Gray |
| 3,623,962 | A | 11/1971 | Beale |
| 4,500,394 | A * | 2/1985 | Rizzo ............................ 205/133 |
| 5,061,144 | A | 10/1991 | Akimoto et al. |
| 5,092,975 | A | 3/1992 | Yamamura et al. |
| 5,227,041 | A | 7/1993 | Brogden et al. |
| 5,312,532 | A | 5/1994 | Andricacos et al. |
| 5,316,642 | A | 5/1994 | Young et al. |

(Continued)

FOREIGN PATENT DOCUMENTS

| JP | 58-181898 | 10/1983 |
| JP | 60-99531 | 7/1985 |

(Continued)

OTHER PUBLICATIONS

Journal Ebara, vol. 181 (Oct. 1998), "Summary of the Plating Apparatus", pp. 42-49 (with English translation).

(Continued)

*Primary Examiner* — Keith Hendricks
*Assistant Examiner* — Stefanie S Wittenberg
(74) *Attorney, Agent, or Firm* — Wenderoth, Lind & Ponack, L.L.P.

(57) ABSTRACT

A semiconductor wafer holder includes first and second holding members between which a semiconductor wafer is held. The second holding member includes a second conductive element placed in contact with a first conductive element of the first holding member and the semiconductor wafer. A ring clamp is used to press the second holding member against the first holding member for holding of the semiconductor wafer.

7 Claims, 14 Drawing Sheets

(56) References Cited

U.S. PATENT DOCUMENTS

| | | |
|---|---|---|
| 5,421,987 A | 6/1995 | Tzanavaras et al. |
| 5,516,412 A | 5/1996 | Andricacos et al. |
| 5,843,296 A | 12/1998 | Greenspan |
| 6,074,544 A | 6/2000 | Reid et al. |
| 6,099,702 A | 8/2000 | Reid et al. |
| 6,113,764 A | 9/2000 | Emch |
| 6,113,769 A | 9/2000 | Uzoh et al. |
| 6,129,100 A | 10/2000 | Kitagawa et al. |
| 6,139,712 A | 10/2000 | Patton et al. |
| 6,174,123 B1 | 1/2001 | Marttila |
| 6,203,582 B1 | 3/2001 | Berner et al. |
| 6,248,222 B1 | 6/2001 | Wang |
| 6,254,760 B1 | 7/2001 | Shen et al. |
| 6,258,220 B1 | 7/2001 | Dordi et al. |
| 6,258,244 B1 | 7/2001 | Ohmi et al. |
| 6,294,059 B1 | 9/2001 | Hongo et al. |
| 6,309,520 B1 | 10/2001 | Woodruff et al. |
| 6,309,524 B1 | 10/2001 | Woodruff et al. |
| 6,391,209 B1 | 5/2002 | Belongia et al. |
| 6,454,918 B1 | 9/2002 | Sakaki |
| 6,517,689 B1 | 2/2003 | Hongo et al. |
| 6,645,355 B2 | 11/2003 | Hanson et al. |
| 7,022,211 B2 * | 4/2006 | Yoshioka et al. ........ 204/297.01 |
| 7,402,227 B2 | 7/2008 | Yoshioka et al. |

FOREIGN PATENT DOCUMENTS

| | | | | |
|---|---|---|---|---|
| JP | 63-028900 | 2/1988 | | |
| JP | 64-10073 | 1/1989 | | |
| JP | 1-116094 | 5/1989 | | |
| JP | 1-104035 | 7/1989 | | |
| JP | 5-206348 | 8/1993 | | |
| JP | 05-222590 | 8/1993 | | |
| JP | 5-247692 | 9/1993 | | |
| JP | 6-108285 | 4/1994 | | |
| JP | 06108285 | * 4/1994 | ............... | C25D 5/02 |
| JP | 6-310461 | 11/1994 | | |
| JP | 6-334087 | 12/1994 | | |
| JP | 7-292498 | 11/1995 | | |
| JP | 8-134699 | 5/1996 | | |
| JP | 11-2000096 | 7/1996 | | |
| JP | 8-253891 | 10/1996 | | |
| JP | 9-59795 | 3/1997 | | |
| JP | 10-25598 | 1/1998 | | |
| JP | 10-233400 | 9/1998 | | |
| JP | 10-287978 | 10/1998 | | |
| JP | 11-140694 | 5/1999 | | |
| JP | 11-152597 | 6/1999 | | |
| JP | 11-152600 | 6/1999 | | |
| JP | 11-172492 | 6/1999 | | |
| JP | 11-195622 | 7/1999 | | |

OTHER PUBLICATIONS

Supplementary European Search Report dated May 15, 2006 in European Application No. 99 91 9638.

* cited by examiner

SEMICONDUCTOR WAFER HOLDER AND ELECTROPLATING SYSTEM FOR PLATING A SEMICONDUCTOR WAFER

This is a divisional application of Ser. No. 12/903,337, filed Oct. 13, 2010, now U.S. Pat. No. 8,075,756 which is a divisional application of Ser. No. 11/373,103, filed Mar. 13, 2006, now U.S. Pat. No. 7,833,393, which is a divisional application of Ser. No. 09/990,387, filed Nov. 23, 2001, now U.S. Pat. No. 7,022,211, which is a continuation application of Ser. No. 09/463,698, filed Jan. 31, 2000, now abandoned, which is a 371 of PCT/JP99/02576, filed May 18, 1999.

BACKGROUND OF THE INVENTION

1. Technical Field

The present invention relates to a semiconductor wafer holder and an electroplating system for plating a semiconductor wafer. The semiconductor wafer holder is designed to hold a semiconductor wafer during electrolytic plating.

2. Description of Related Art

A conventional semiconductor wafer holder holds a semiconductor wafer so that a conductive pin is placed in contact with a conductive layer of the semiconductor wafer during electrolytic plating. The wafer holder together with the semiconductor wafer is immersed in an electrolyte bath within which an electrolytic solution is contained. Electrical current is supplied to the semiconductor wafer through the electrolytic solution and the conductive pin for electrolytic plating of the semiconductor wafer.

With such an arrangement, however, it is not easy to mount the semiconductor wafer to the holder. Also, the conductive pin can not be reliably contacted with the conductive layer of the semiconductor wafer.

In view of the foregoing, it is a first object of the present invention to provide a semiconductor wafer holder which enables ready mounting of a semiconductor wafer and reliable application of electrical current to a conductive layer of the semiconductor wafer.

The prior art semiconductor wafer holder includes a packing for sealing of the conductive pin. The packing extends between the semiconductor wafer and a holding element by which the semiconductor wafer is held. A plurality of bolts are tightened to clamp the packing, whereby uniform pressure is exerted on the packing to seal the conductive pin.

Such an approach is, however, cumbersome. It is also difficult to apply uniform torque to each bolt. Uneven application of torque may cause the electrolytic solution to reach the conductive pin.

In view of the foregoing, it is a second object of the present invention to provide a semiconductor wafer holder which facilitates clamping of a packing and enables uniform application of a clamping force to the perimeter edge of the packing.

SUMMARY OF THE INVENTION

According to a first aspect of the present invention, there is provided a semiconductor wafer holder comprising a first holding member, and a second holding member with a packing adapted to cooperate with the first holding member to sandwich a semiconductor wafer. The semiconductor wafer is exposed through inside of the packing.

The first holding member includes a first conductive element adapted for electrical connection with an external electrode.

The second holding member includes a second conductive element adapted for contact with the first conductive element of the first holding member and a conductive layer of the semiconductor wafer and sealed by the packing.

In the first aspect of the invention, it is preferable that the packing has an annular shape, and the first conductive element is arranged adjacent to the outer periphery of the semiconductor wafer held between the first and second holding members.

It is also preferable that the packing has an inverted U-shaped section, with opposite end projections placed in contact with the first holding member and the semiconductor wafer, respectively, and the packing includes a hole defined between the end projections, the second conductive element being received in the hole.

The second conductive element preferably has an inverted U-shaped section, with two end projections configured to bridge between the first conductive element and the conductive layer of the semiconductor wafer. A resilient member is preferably used to mount the second conductive element within the hole.

In another embodiment, a semiconductor wafer holder comprises a first holding member including a first conductive element, and a second holding member including a second conductive element, wherein the first holding member and the second holding member are operatively associated with each other so as to releasably hold a semiconductor wafer therebetween, and the first conductive element and the second conductive element are maintained out of contact with a plating liquid, and wherein the second conductive element of the second holding member is held in contact with the first conductive element of the first holding member and the semiconductor wafer when the semiconductor wafer is sandwiched between the first holding member and the second holding member.

According to a second aspect of the present invention, there is provided a semiconductor wafer holder comprising a plate-like first holding member, an annular second holding member with a packing mounted thereon, a ring clamp operable to press the second holding member against the first holding member so as to hold a semiconductor wafer therebetween, and a conductive member placed in contact with the conductive layer of the semiconductor wafer and sealed by the packing.

In another embodiment, a semiconductor wafer holder comprises a first holding member in the form of a plate, an annular second holding member including a packing mounted thereon, and a ring clamp operable to press the second holding member against the first holding member so as to hold a semiconductor wafer therebetween.

The first holding member includes a first conductive element arranged adjacent to the outer periphery of the semiconductor wafer held between the first and second holding member.

Also, the packing of the second holding member includes a second conductive element placed in contact with the first conductive element and the conductive layer of the semiconductor wafer held between the first and second holding members and sealed by the packing.

It is preferable that the ring clamp includes a plurality of protrusions formed on its outer periphery and arranged at given intervals, and the first holding member includes a plurality of pawls of an inverted L-shape. The plurality of protrusions are slid below the plurality of pawls to thereby clamp the first and second holding members together when the ring clamp is rotated by a given angle.

It is also preferable that the first holding member and the second holding member are connected by and pivoted about a hinge mechanism.

It is further preferable that the second holding member and the ring clamp are connected by a ring retainer and capable of rotation on the second holding member by a given angle.

In another embodiment, a semiconductor wafer holder comprises a first holding member, a second holding member and a clamping ring movable between a clamp position and an open position and including a locking member.

The first and second holding members are cooperative to releasably hold a semiconductor wafer therebetween.

One of the first and second holding members includes a lockable portion to be releasably engaged with the locking member.

The locking member is engaged with the lockable portion so as to lock the first and second holding members together when the clamping ring is held in the clamp position.

Also, the first holding member and the second holding member are unlocked when the clamping ring is held in the open position, whereby the semiconductor wafer can be loaded between and unloaded from the first and second holding members.

According to a third aspect of the present invention, there is provided an electroplating system for plating a semiconductor wafer comprising a semiconductor wafer holder as set forth in any one of the foregoing embodiments.

In the third aspect of the invention, an electroplating system for plating a semiconductor wafer, comprises a loading/unloading station for transferring the semiconductor wafer from a wafer cassette to a semiconductor wafer holder and vice versa, and a plating bath station including a plating bath within which a plating liquid is contained, the semiconductor wafer holder with the semiconductor wafer mounted therein being immersed in the plating liquid whereby the semiconductor wafer is plated.

DETAILED DESCRIPTION OF THE INVENTION

The present invention will now be described with reference to the drawings. FIGS. 1, 2, 3A and 3B show a semiconductor wafer holder according to one embodiment of the present invention. FIGS. 7A, 7B, 8, 9 and 10 show another embodiment of the semiconductor wafer holder according to the present invention.

Figure 1:
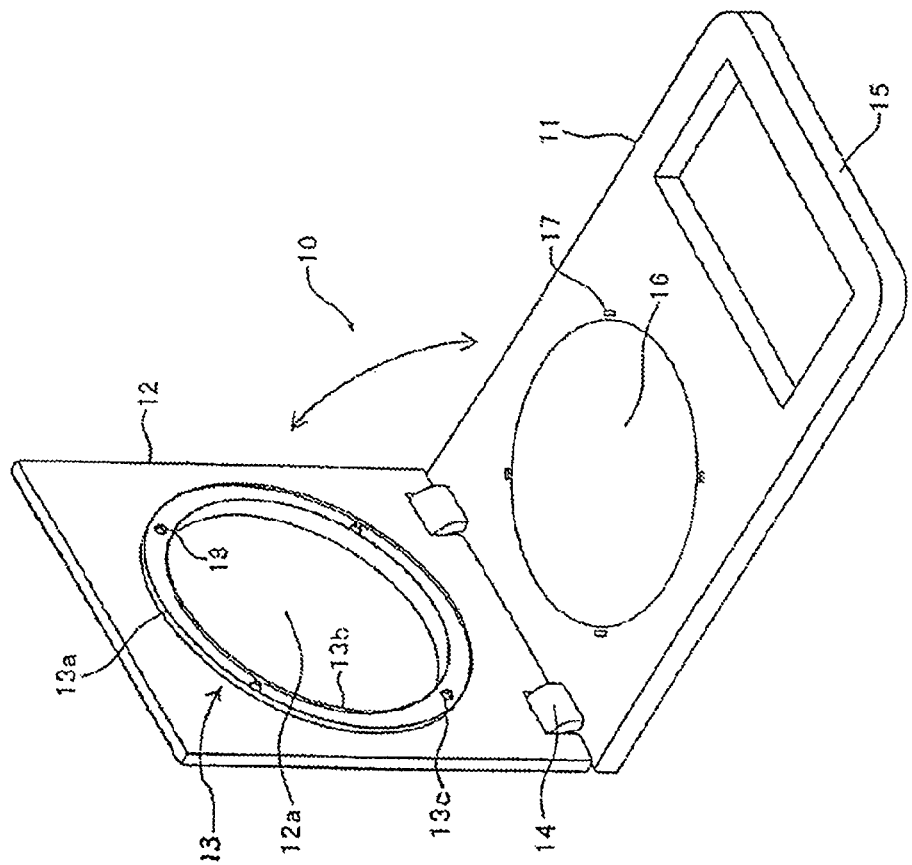
FIG. 1 is a perspective view showing the outer appearance of a semiconductor wafer holder according to one embodiment of the present invention.

FIG. 1 is a perspective view showing the outer appearance of a semiconductor wafer holder according to one embodiment of the present invention. As shown, a holder 10 includes a first, plate-like holding member 11 made of an electrically insulative material (such as synthetic resin), and a second, plate-like holding member 12 made of an electrically insulative material (such as synthetic resin) and provided with an annular seal or packing 13. The second holding member 12 is connected to the first holding member 11 by means of a hinge mechanism 14. A handle 15 is formed at one end of the first holding member 11 remote from the hinge mechanism 14.

A recess is formed in the upper surface of the first holding member 11 to receive a semiconductor wafer 16. The recess is substantially identical in shape to the semiconductor wafer 16. A plurality of first conductive elements 17 (four conductive elements are shown) are arranged in the outer periphery of the recess in a circumferentially equally spaced relationship. The top surface of each of the first conductive elements 17 is substantially coincident with the top surface of the first holding member 11. The second holding member 12 has a central opening 12a which has an inner diameter slightly smaller than the diameter of the semiconductor wafer 16. An annular packing 13 is placed on the second holding member 12 and secured to the perimeter edge of the opening 12a.

The packing 13 has an inverted U-shaped section, with opposite end projections 13a, 13b. The packing 13 has a width so that the end projections 13a, 13b are contacted with the upper surface of the first holding member 11 and the surface of the semiconductor wafer 16, respectively. The end of the packing 13 projects from the upper surface of the second holding member 12 by a predetermined distance. A plurality of holes 13c (four are shown) are formed in the packing 13 to receive a plurality of corresponding second conductive elements 18 which will later be described. The holes 13c are arranged between the end projections 13a, 13b and spaced at given intervals.

With this arrangement, the second holding member 12 is placed on the first holding member 11 through the hinge mechanism 14 after the semiconductor wafer 16 is inserted within the recess of the first holding member 11. At this time, the end projections 13a, 13b of the packing 13 are brought into contact with the upper surface of the first holding member 11 and the surface of the semiconductor wafer 16, respectively. The first holding member 11 cooperates with the packing 13 to sandwich the perimeter edge of the semiconductor wafer 16. The surface of the semiconductor wafer 16 is exposed through the opening 12a of the second holding member 12.

Figure 2:
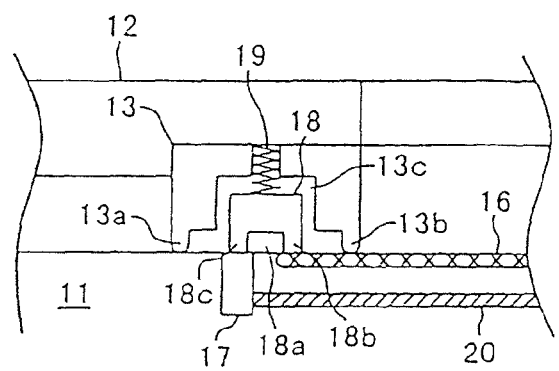
FIG. 2 is a sectional view illustrating the positional relationship between a first conductive element and a packing when a second holding member is placed on a first holding member of the semiconductor wafer holder shown in FIG. 1.

FIG. 2 illustrates the positional relationship between the first conductive elements 17 and the packing 13 when the second holding member 13 is placed on the first holding member 11. As shown, the end projections 13a, 13b of the packing 12 are placed in contact with the upper surface of the first holding member 11 and the upper surface of the semiconductor wafer 16, respectively. The second conductive elements 18 have a cylindrical configuration. A slot 18a is formed in one end of each of the second conductive elements 18 to provide two end projections 18b, 18c. The second conductive element 18 thus has an inverted U-shaped section. The second conductive element 18 is attached to the second holding member 12 by a spring 19 so that the end projections 18b, 18c are in contact with a conductive layer on the top of the semiconductor wafer 16 and the upper surface of the first conductive element 17, respectively. A conductive member 20 extends through the first holding member 11. The first conductive element 17 is connected through the conductive member 20 to an external electrode (not shown).

Figure 3B:
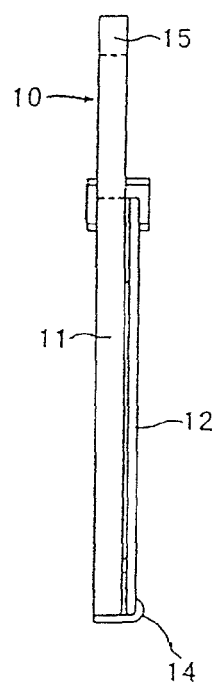
FIG. 3B is a side view of the semiconductor wafer holder.
Figure 3A:
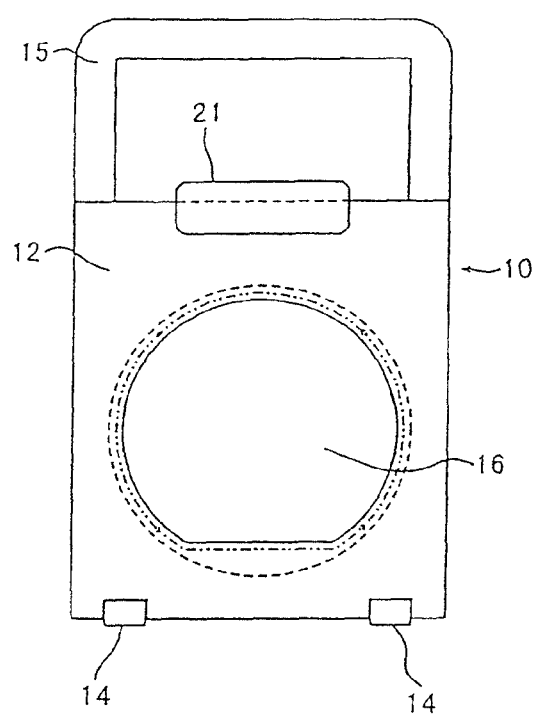
FIG. 3A is a front view of the semiconductor wafer holder.

FIGS. 3A and 3B show the state in which the second holding member 12 is placed on the first holding member 11. FIGS. 3A and 3B are front and side views of the wafer holder 10. As shown, one end of the first holding member 11, which includes the handle 15, and one end of the second holding member 12 remote from the hinge mechanism 14 are secured by a clamp 21. By this arrangement, the semiconductor wafer 16 is held between the first holding member 11 and the packing 13, and the conductive member 20 is reliably electrically connected to the conductive layer of the semiconductor wafer 16 through the first conductive elements 17 and the second conductive elements 18. As mentioned earlier, the conductive layer of the semiconductor wafer 16 is connected to the external electrode.

Figure 4:
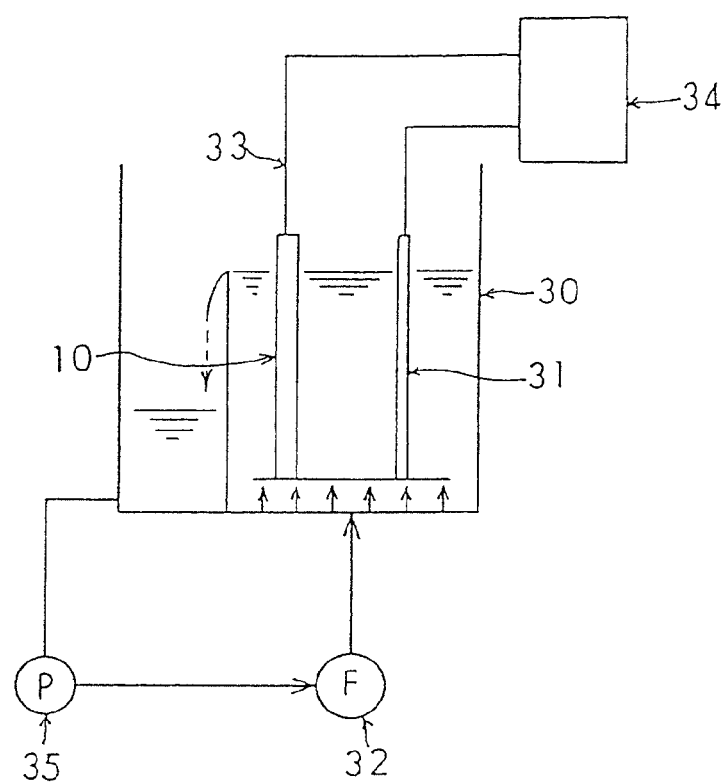
FIG. 4 is a schematic view of an electroplating system according to another embodiment of the present invention.

FIG. 4 is a schematic view of an electroplating system with the semiconductor wafer holder 10. In this figure, 30 denotes a plating bath within which an anode 31 and the semiconductor wafer holder 10 are placed. A pump 35 is used to send an electrolytic solution to the plating bath 30 through a filter 32. Part of the electrolytic solution which overflows from the plating bath 30 is returned to the pump for circulation through the system. A direct current source 34 has a positive terminal connected to the anode and a negative terminal connected to an external electrode 33. The semiconductor wafer is plated upon supply of direct current from the direct current source 34.

Figure 5:
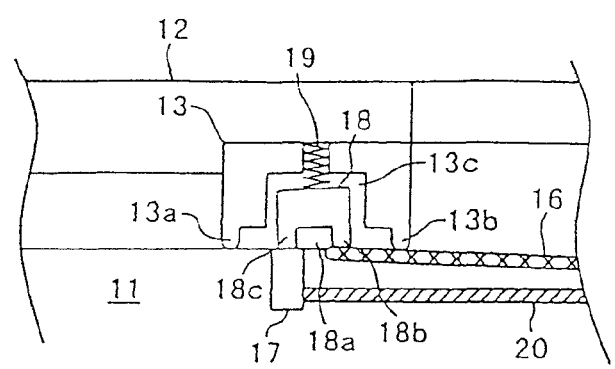
FIG. 5 is a sectional view of another embodiment of the semiconductor wafer holder, illustrating the positional relationship between a first conductive element and a packing when a second holding member is placed on a first holding member of the semiconductor wafer holder.

As mentioned earlier, the wafer holder includes two separate conductors (the first and second conductive elements 17, 18) mounted to the first and second holding members 11, 12, respectively. The semiconductor wafer 16 is conveniently contained in the recess of the first holding member 11, and the conductive member 20 extends through the first holding member 11. The second conductive elements 18 as a conductive pin are mounted to the other, second holding member 12. This arrangement facilitates mounting of the semiconductor wafer 16. The second conductive elements 18 have an inverted U-shaped section and are mounted to the second holding member 12 by means of the spring 19. The two end projections of each of the second conductive elements 18 are in contact with the first conductive elements 17 and the conductive layer of the semiconductor wafer 16, respectively. This arrangement enables reliable supply of current to the conductive layer if, for example, the top of the semiconductor wafer 16 is not coincident with the top of the first conductive element 17 as shown in FIG. 5.

Figure 6:
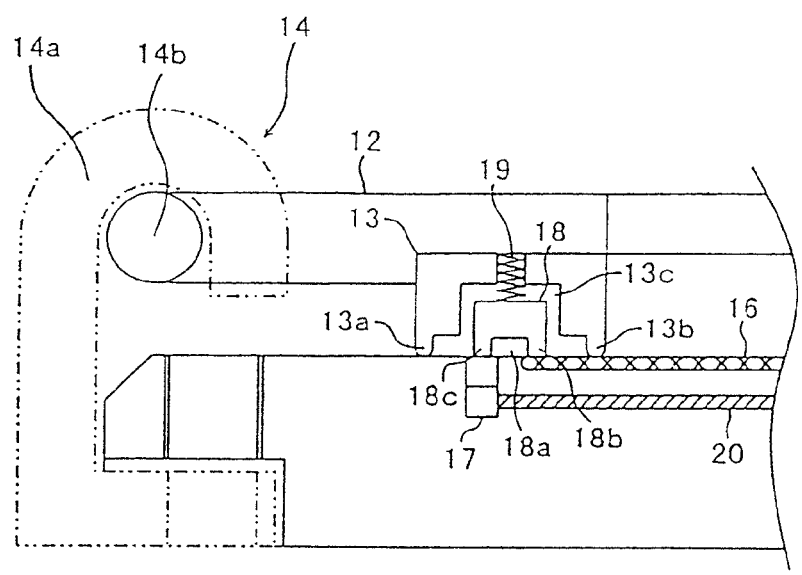
FIG. 6 is a sectional view of one form of a hinge mechanism.

FIG. 6 shows one form of the hinge mechanism 14. The hinge mechanism 14 includes a hinge body 14a secured to the first holding member 11 and a hinge pin 14b secured to the second holding member 12 for engagement with the hinge body 14a.

Illustratively, the springs 19 are used to mount the second conductive elements 18 to the second holding member. However, any other resilient materials may, alternatively, be employed.

Figure 7:
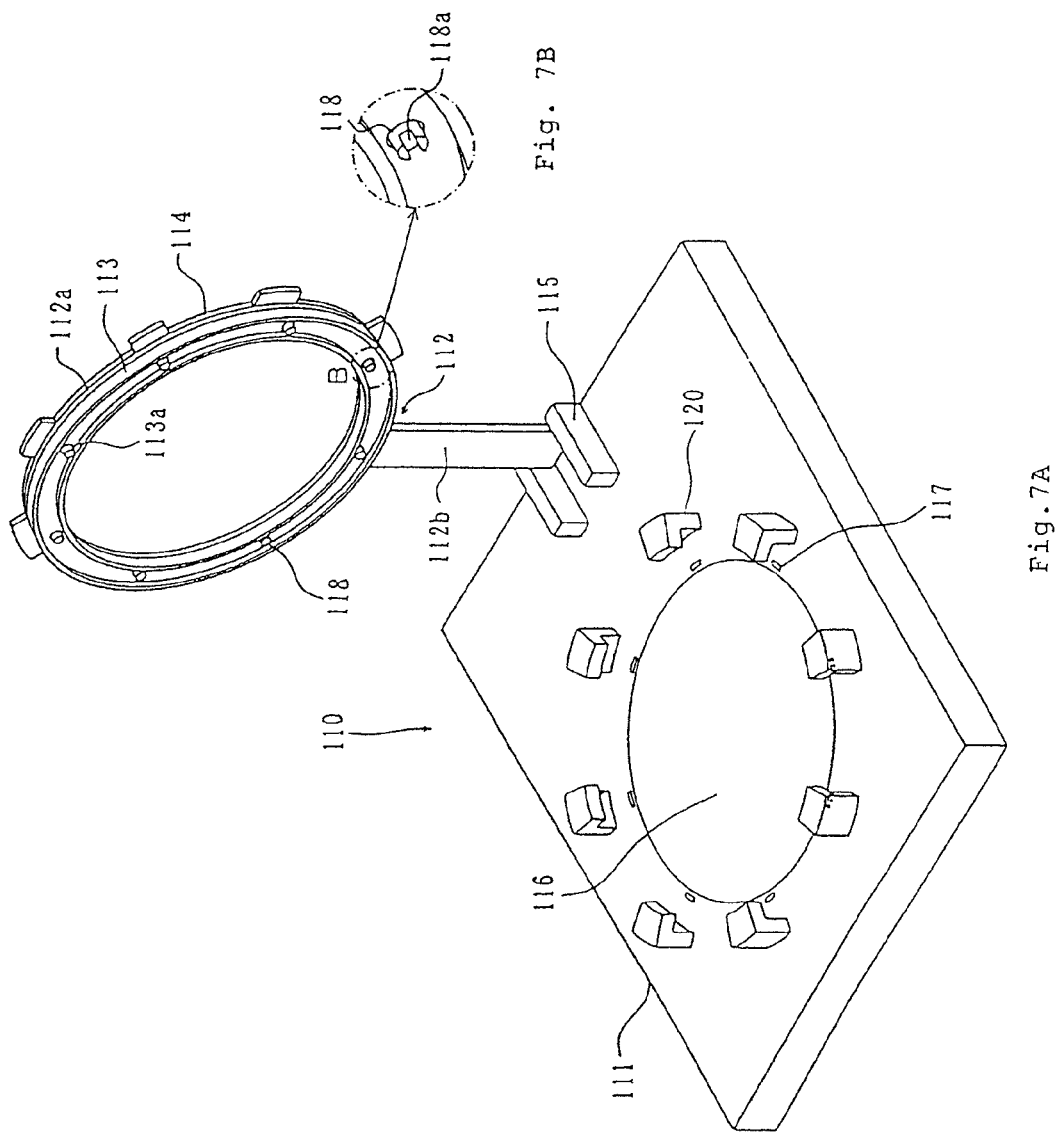
FIG. 7A is a perspective view showing the outer appearance of a semiconductor wafer holder according to another embodiment of the present invention, with a first holding member in its open position.
FIG. 7B is an enlarged view of a portion B encircled in FIG. 7A.
Figure 8:
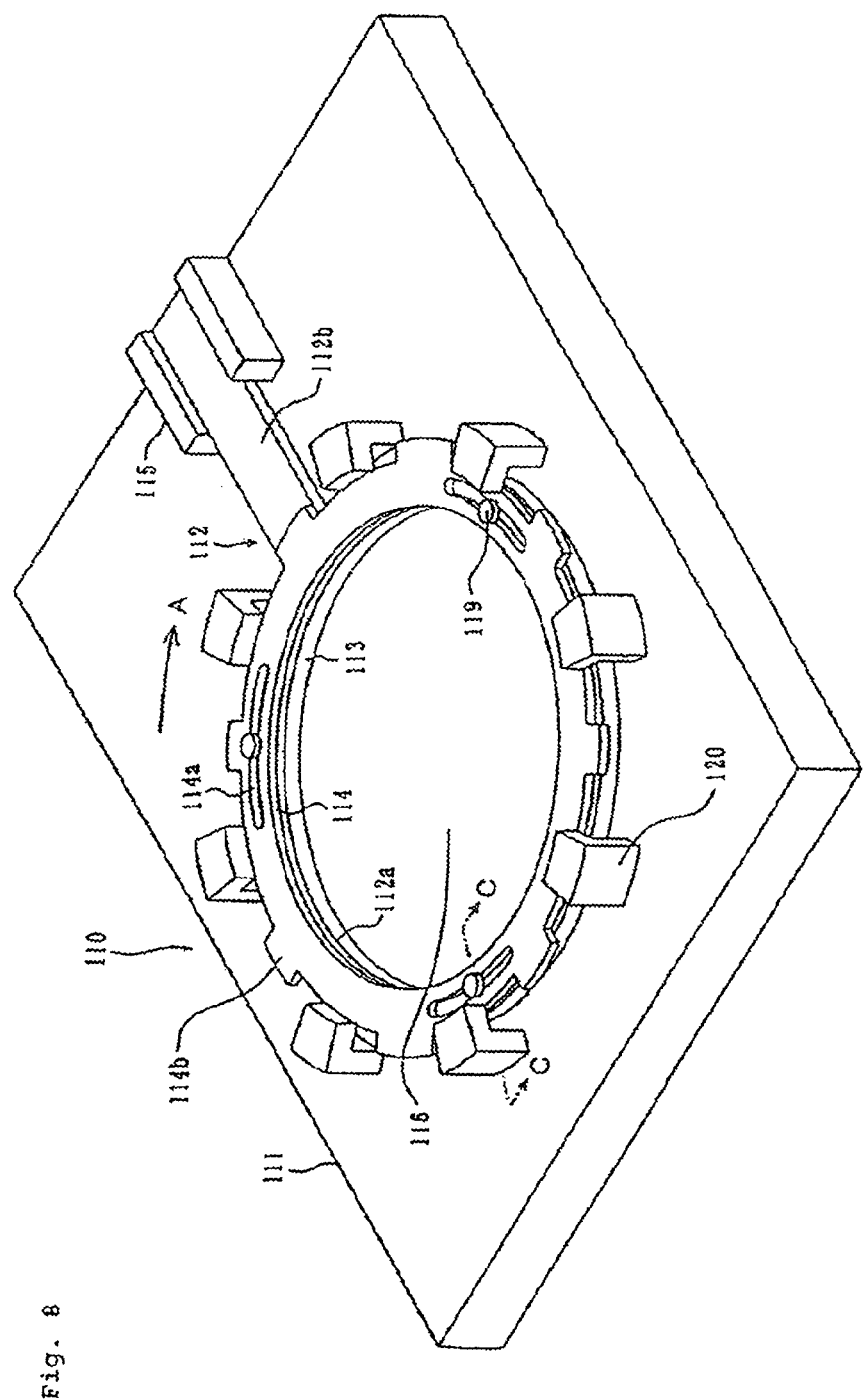
FIG. 8 is a perspective view showing the outer appearance of the semiconductor wafer holder shown in FIG. 7A, with the first holding member in its closed position.

FIGS. 7A, 7B and 8 are perspective views showing the outer appearance of a semiconductor wafer holder according to the present invention. As shown, a wafer holder 110 includes a plate-like first holding member 111, a second holding member 112 to which an annular seal or packing 113 is mounted, and a ring clamp 114.

The first holding member 111 is made of an electrically insulative material (such as synthetic resin). The first holding member 111 is in the form of a rectangular plate and has a central recess within which a semiconductor wafer 116 is placed. A plurality of first conductive elements 117 (eight conductive elements are shown) are located adjacent to the perimeter edge of the central recess and arranged in a circumferentially equally spaced relationship. The tops of the first conductive elements 117 are substantially coincident with that of the first holding member 111. A plurality of pawls 120 (eight are shown) are arranged outside of the first conductive elements 117 and spaced at equal intervals. The pawls 120 have an inverted L-shape.

The second holding member 112 is made of an electrically insulative material (such as synthetic resin). As shown, the second holding member 112 includes a ring 112a and a straight arm 112b integrally formed with the ring 112a. The packing 113 has an inverted U-shape and is made of an electrically insulative material such as rubber and other elastic materials. As shown, the packing 113 is attached to one side of the ring 112a of the second holding member 112. A plurality of holes 113a (eight holes are shown) are formed, at equal intervals, in the packing 113 and located between its opposite end projections. Inserted within the holes 113a are a plurality of second conductive elements 118 which will later be described (see FIG. 7B).

A plurality of protrusions 114b (eight protrusions are shown) extend from the outer periphery of the ring clamp 114 and are arranged at given intervals. A plurality of guide slots 114a (four slots are shown) are formed in the upper side of the ring clamp 114 and arranged at given intervals. A plurality of ring retainers 119 are formed on the top surface of the ring 112a of the second holding member 112 and extend through the guide slots 114a. The ring clamp 114 is capable of rotation (sliding movement) on the top surface of the second holding member 112. Specifically, the ring clamp 114 is rotated on the ring 112a by a given angle while being guided by the ring retainers (three retainers are shown). The arm 112b of the second holding member 112 has one end pivotally connected to one side of the first holding member 111 by means of a hinge mechanism 115.

With the wafer holder 110 thus constructed, the second holding member 112 is pivoted through the hinge mechanism 115 and then, placed on the first holding member 111. The ring 114 is pushed or rotated in the direction of arrow A. This rotation causes the protrusions 114b to slide below the pawls 120. As a result, the first holding member 111 and the second holding member 112 are clamped together.

Figure 9:
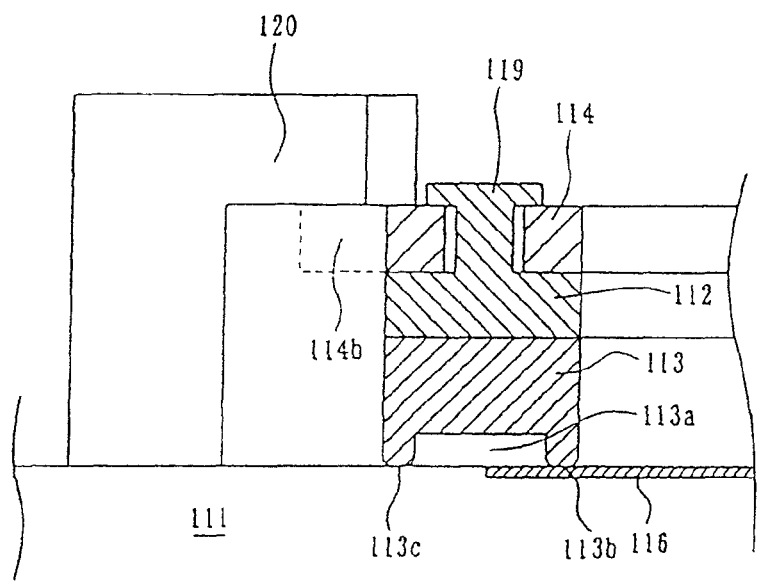
FIG. 9 is a sectional view taken along the line C-C of FIG. 8.

With the first holding member 111 and the second holding member 112 clamped together, the end projection 113b is contacted with the perimeter edge of the semiconductor wafer held within the recess of the first holding member 111, as shown in FIG. 9. The other end projection 113e is in contact with the first holding member 111.

Figure 10:
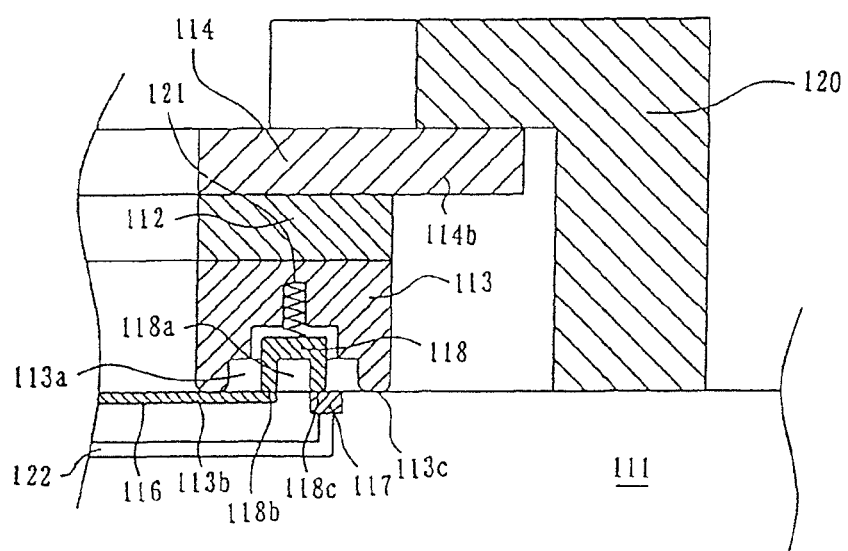
FIG. 10 is a sectional view showing the positional relationship between the first conductive element and a semiconductor wafer during clamping.

The second conductive element 118 is made of an electrically insulative material (such as synthetic resin) and takes a cylindrical shape. A slot 118a is formed in one end of the second conductive element 118 so that the second conductive element 118 has an inverted U-shape. The other, rear end of the second conductive element 118 is attached to the packing 113 or the second holding member 112 through a spring 121. With the second holding member 112 placed on the first holding member 111, the end projection 118b of the second conductive element 118 is in contact with the conductive layer on the semiconductor wafer 116, whereas the end projection 118c is in contact with the first conductive element 117, as shown in FIG. 10. A conductive member 122 extends through the first holding member 111. The first conductive element 117 is connected to the conductive member 122 which is, in turn, connected to an external electrode, not shown.

In this embodiment, the protrusions 114b are arranged, at given intervals, on the outer periphery of the ring clamp 114. Upon rotation of the ring clamp 114, the protrusions 114b are slidably moved below the pawls 120 so as to clamp the first holding member 111 and the second holding member 112 together. This arrangement enables uniform application of pressure on the packing 113 and thus, provides a better seal. It will be noted that the first conductive element 117 is connected to the conductive member 122 which is, in turn, connected to an external electrode, not shown.

In the embodiment shown in FIG. 10, the end projection 118b of the second conductive element 118 is contacted with the conductive layer on the semiconductor wafer 116, and the other end projection 118c is contacted with the first conductive element 117 when the second holding member 112 is superposed on the first holding member 111.

Figure 11:
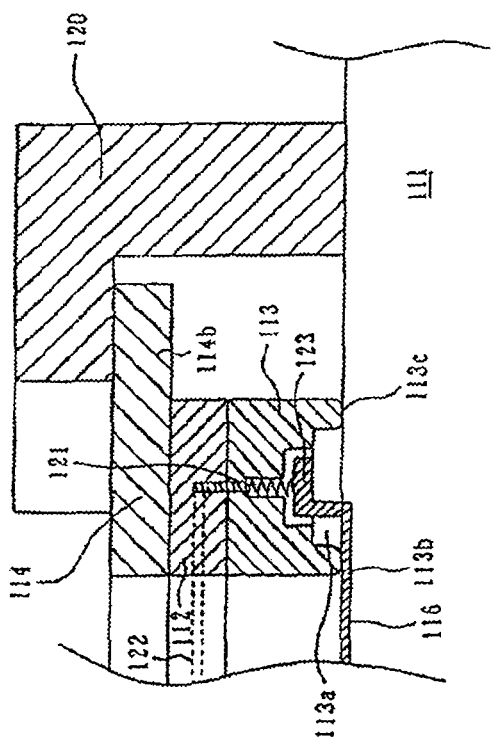
FIG. 11 is a sectional view showing the positional relationship between a conductive member and a semiconductor wafer during clamping.

Alternatively, the first conductive element 117 may be omitted. As shown in FIG. 11, a conductive member 123 may be contacted with the conductive layer of the semiconductor wafer 116. The conductive member 122 may also extend through the second holding member 112 and may be connected to the conductive member 123 through the spring 121.

The wafer holder 110 shown in FIGS. 7A, 7B, 8 and 9 may be used with the electroplating system shown in FIG. 4.

The semiconductor wafer holder of the present invention is suitable for use in the electroplating system.

In a conventional "dip-type" plating system, a semiconductor wafer must manually be mounted to a carrier or holder. However, a larger semiconductor wafer is difficult to mount by hand. There thus exists a need for a fully automated electroplating system to plate an 8-inch semiconductor wafer. In such a system, a start button is pressed to thereby automatically plate a wafer while a wafer cassette within which the wafer is mounted is placed in a given position. The wafer is, thereafter, loaded back into the wafer cassette.

Figure 12:
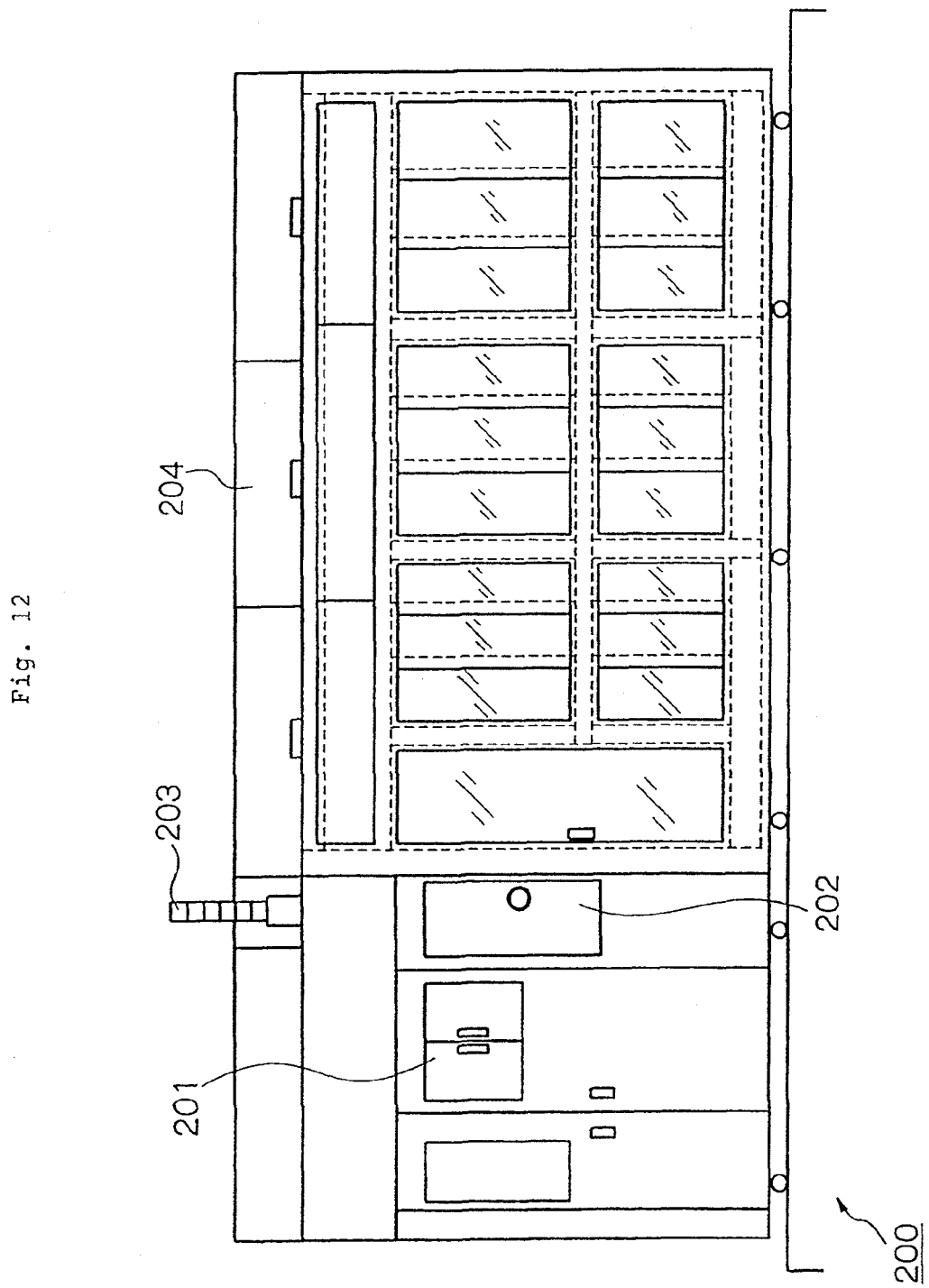
FIG. 12 is a side view of an electroplating system for plating a semiconductor wafer, made according to a different embodiment of the present invention.
Figure 13:
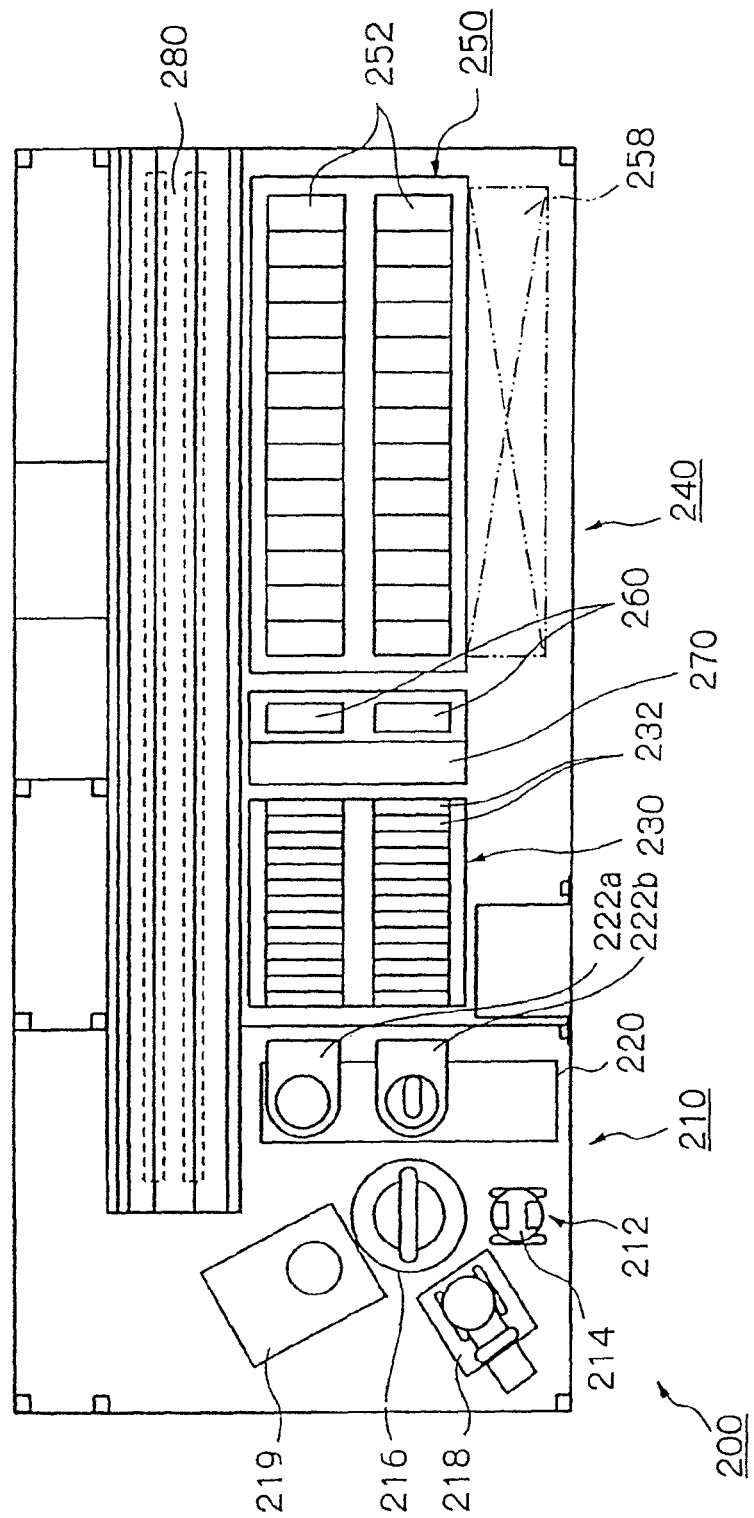
FIG. 13 is a plan view of the electroplating system.

FIGS. 12 and 13 show one form of an electroplating system for plating a semiconductor wafer. This system is suitable for use with the wafer holder of the present invention. In FIG. 12, an electroplating system 200 includes a wafer inlet 201 through which a wafer cassette is introduced, a control panel 202 for controlling a loading/unloading station and a plating bath station, a signal tower 203, and an electric box 204 electrically connected to the control panel 202.

In FIG. 13, the electroplating system includes a loading/unloading station 210 and a plating bath station 240. In the loading/unloading station 210, a wafer is removed from a wafer cassette and thereafter, removably mounted to the wafer holder. Also, the wafer is removed from the wafer holder and thereafter, loaded within the wafer cassette. The wafer holder of the present invention enables the use of the loading/unloading station 210. In the bath station 240, the wafer holder is immersed in an electrolytic solution within a plating bath for electroplating of the semiconductor wafer.

Again, an electroplating system according to a third aspect of the invention provides a loading/unloading station whereby a wafer is transferred from a wafer cassette to the wafer holder, and the wafer is transferred from the wafer holder to the wafer cassette, and a plating bath station wherein the wafer is plated while the wafer holder is immersed in an electrolytic solution within a plating bath.

The loading/unloading station 210 includes, among others, a cassette table 212 on which a wafer cassette is placed, a wafer transfer robot 216, a wafer centering device 218, and a spin dryer 219. Preferably, the cassette table 212 includes a sensor unit 214 for detecting the existence of a wafer within a wafer cassette. The sensor unit 214 includes a sensor for detecting as to whether or not a wafer is mounted in a given position within a wafer cassette, and a drive for moving the sensor. The sensor is typically moved in a vertical direction. The wafer transfer robot 216 is capable of removing a wafer from a wafer cassette and transferring the wafer to a holder clamp. The wafer transfer robot 216 is also capable of unloading the wafer from the holder clamp and transferring the wafer to the wafer cassette. The wafer transfer robot 216 is preferably moved for rotation. The spin dryer 219 is design to dry a semiconductor wafer after it has been plated.

Figure 14A:
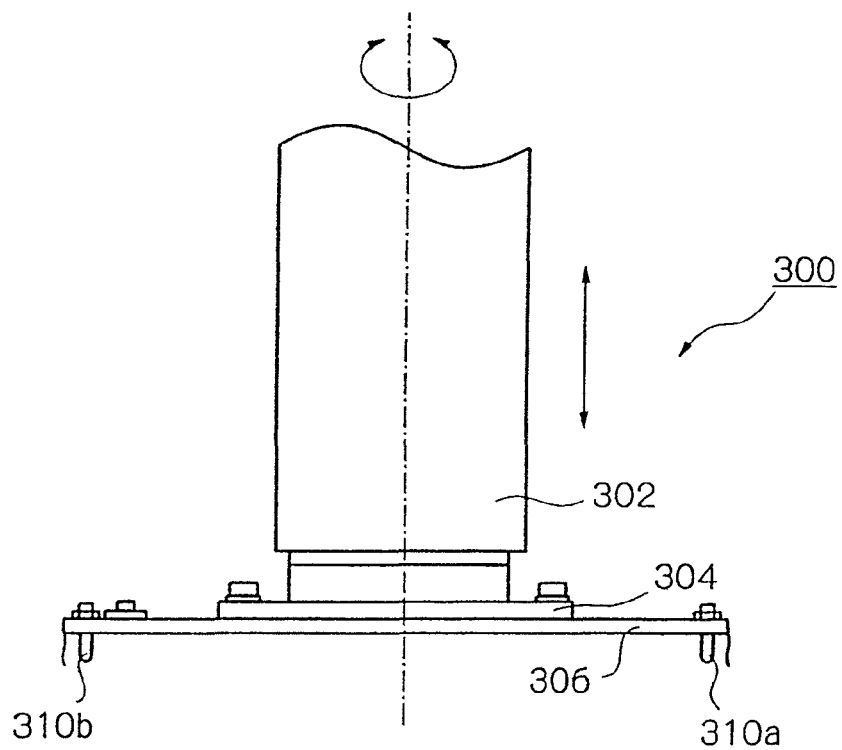
FIG. 14A is a sectional view of one form of a holder clamp.

The loading/unloading station 210 includes one or more tables 220 with wafer loading/unloading tables 222a, 222b. The wafer loading/unloading table 222a is moved to and away from the wafer loading/unloading table 222b, and vice versa. A holder clamp is mounted to the upper part of the wafer loading/unloading table 222b. One form of the holder clamp is shown in FIGS. 14A and 1413. The loading/unloading station preferably includes a means (not shown) for detecting as to whether or not a wafer is electrically connected to the wafer holder.

The electroplating system 200 includes a holder container 230 within which holders 232 are contained. In the embodiment shown in FIG. 13, the holder container 230 includes upper and lower sections, with thirteen holders being contained in each section. The holder container 230 preferably includes a sensor for detecting the existence of a holder.

The bath station 240 includes, among others, a plating bath 250, a cleaning bath 260 and a dryer 270. The plating bath 250 preferably includes a plurality of compartments 252. In each compartment, one holder within which a wafer is loaded is immersed in an electrolytic solution for plating. Preferably, each compartment includes a portion into which a holder is introduced, a unit for supplying electrical current to the holder, and an anode. An exposed surface of the anode which is oriented to face with a wafer is preferably concentric with the wafer. A plurality of compartments may be agitated by a single agitator 258. For example, an agitator rod may be moved in a direction parallel to the surface of a wafer to agitate two compartments. The agitator rod may have variable speeds.

In the cleaning bath 260, it is preferable that pure water is caused to flow upwardly from its bottom so as to clean the holder and a plated surface of the wafer within the holder. It is also preferable that the holder is quickly dumped into the cleaning bath so as to improve the cleaning result.

It is preferable to use the dryer 270 to dry the holder and a wafer loaded within the holder. A suitable gas may be blown to remove water droplets from the holder and the wafer.

Thereafter, the holder is transferred to the holder loading/unloading tables 222a, 222b. The wafer is removed from the holder and then, loaded within the wafer cassette.

The holder transfer robot is moved along a travel of path 280 so as to move the holder between the loading/unloading station 210 and the plating bath station 240.

A HEPA filter is preferably attached to the ceiling (not shown) of the loading/unloading station 210 to cause fresh air to flow downwardly from the ceiling. This prevents the flow of steam from the plating bath 250 to the loading/unloading station 210.

In the event of a failure, it is preferable to first develop an alarm signal and give an indication to that effect and then, automatically stop the electroplating system.

Operation of the electroplating system is as follows. First, a wafer is removed from the wafer cassette. The wafer is then loaded into the wafer holder. These steps thus include removal of wafer from the wafer cassette and transfer of the holder 232 from the holder container 230 to the wafer loading/unloading table 222b.

More specifically, the wafer cassette is placed at a given location in the loading/unloading station. The start button is then pressed to cause a holder transfer robot (not shown) to move the holder 232 out of the holder container 230. The holder is then placed on the wafer loading/unloading table 222b. The wafer transfer robot 216 is operable to move a wafer out of the wafer cassette. The wafer is then placed on the wafer loading/unloading table 222b.

The holder clamp is then operable to load the wafer into the holder on the wafer loading/unloading table 222b. The wafer loading/unloading table 222b is thereafter moved to an area where the wafer loading/unloading station 222a is located. The holder transfer robot (not shown) is operable to transfer the holder together with a wafer from the wafer loading/unloading table 222a to a compartment 252 in the plating bath 250. Electrical current is then supplied for a predetermined period of time so as to plate the wafer.

When the wafer has been plated, the holder transfer robot is operable to transfer the holder to the cleaning bath 260. After the wafer is cleaned, a gas is blown from the dryer 270 to remove water droplets from the wafer.

The holder transfer robot is again operable to transfer the holder to the holder clamp. The wafer is, then, unloaded from the holder. The wafer is, thereafter, introduced into a spin dryer 219. On the other hand, the holder is transferred to the holder container 230. The wafer is rinsed while it is rotated within the dryer. The wafer is, thereafter, rotated at a high speed to finalize the drying process. After the wafer has been dried, the wafer is returned to the wafer cassette within which the wafer is originally loaded. When all the wafers are completely processed, a buzzing sound is produced, and the system is in a standby position.

FIG. 14A shows one form of the holder clamp. Specifically, a holder clamp 300 includes a drive, not shown, a rotary shaft 302 capable of reciprocation along its own axis and rotation about its own axis, a circular disk 304 mounted on the shaft 302, and a circular disk 306 fixed to the circular disk 304. The circular disk 306 includes a means for detachable engagement with the wafer holder. Illustratively, such a means includes a plurality of pins 310a, 310b.

Figure 14B:
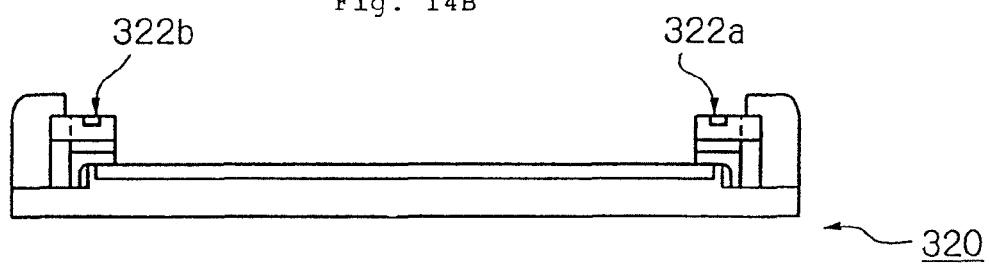
FIG. 14B is a sectional view of one form of a semiconductor wafer holder.

As shown in FIG. 14B, a wafer holder 320 includes holes 322a, 322b. The pins 310a, 310b are inserted into these holes 322a, 322b, respectively when the drive causes downward movement of the shaft 302. When the shaft is rotated in a clockwise or counterclockwise direction by a fixed angle, the pins 310a, 310b cause the wafer holder 320 to rotate by a fixed angle. This rotation allows the wafer holder 320 to clamp or fasten a semiconductor wafer loaded in the wafer holder. Thereafter, the shaft 302 is lifted to disengage the pins 310a, 310b from the wafer holder.

In the embodiment shown in FIG. 8, for example, when the holder clamp 300 is lowered, the pins 310a, 310b are inserted into the grooves where the ring retainers 119 are disposed. When the pins 310a, 310b are rotated by a fixed angle, the ring clamp 119 is rotated to clamp the ring clamp 114 and thus, the semiconductor wafer.

Reverse operation causes the ring clamp 114 of the wafer holder 320 to rotate in an opposite direction. This rotation loosens the ring clamp 114.

The present invention provides the following advantageous effects.

In one aspect of the present invention, the semiconductor wafer 16 can readily be mounted or loaded.

The packing has an inverted U-shape with opposite end projections placed in contact with the first holding member and the semiconductor wafer, respectively. The end projections collectively define a hole within which the second conductive element is received. The second conductive element is mounted to the second holding member through a resilient material. This arrangement provides a simple wafer holder with its electrical contact reliably sealed by the packing.

The second conductive element has an inverted U-shape section with opposite end projections bridging between the first conductive element of the first holding member and the conductive layer of the semiconductor wafer. The second conductive element is mounted to the second holding member through a resilient material. This arrangement ensures supply of electrical current to the conductive layer of the semiconductor wafer.

In another aspect of the present invention, the ring clamp is employed to press the second holding member against the first holding member. This arrangement enables uniform application of pressure onto the packing and provides a better seal.

The use of the inverted L-shaped pawls makes it easy to seal the required part.

Additionally, the use of the hinge mechanism facilitates positioning between the first and second holding members.

Finally, the ring clamp is capable of rotation on the second holding member by a given angle. This configuration allows for ready positioning of the ring clamp relative to the pawls.

What is claimed is:

1. A semiconductor wafer holder for use in an electroplating apparatus having a holder transfer robot and a plating bath, said semiconductor wafer holder comprising:
a first holding member having a first conductive element;
a second holding member having a second conductive element and at least one annular packing having two projections,
wherein said first and second holding members are provided for holding a semiconductor wafer therebetween,
wherein, said first and second holding members hold the semiconductor wafer therebetween, and one of said two projections contacts a surface of said first holding member and another of said two projections contacts a surface of the semiconductor wafer, said two projections defining a sealed hole therebetween that is sealed from an electroplating solution, and said second conductive element being located in the sealed hole, wherein, said first and second holding members hold the semiconductor wafer therebetween, and said first conductive element is configured to supply electricity to said second conductive element and said second conductive element is configured to supply the electricity from said first conductive element to the semiconductor wafer, wherein said semiconductor wafer holder is configured to be transferred by the holder transfer robot to and from the plating bath, and wherein said second conductive element is free from contact with said at least one annular packing.

2. A semiconductor wafer holder according to claim 1, wherein said first and second conductive elements are in direct contact with each other when said semiconductor wafer holder is holding the semiconductor wafer.

3. A semiconductor wafer holder according to claim 1, wherein, when said first and second holding members are holding the semiconductor wafer therebetween, said at least one annular packing seals a peripheral edge of one side of the semiconductor wafer, an opposite side of the semiconductor wafer, and said first and second conductive elements from the electroplating solution.

4. A semiconductor wafer holder according to claim 1, wherein said second conductive element resiliently contacts the semiconductor wafer.

5. A semiconductor wafer holder according to claim 1, wherein said first and second holding members each comprise an electrically insulative material.

6. A semiconductor wafer holder according to claim 1, wherein said first holding member has a recess within which the semiconductor wafer is placed.

7. A semiconductor wafer holder according to claim 1, wherein adjacent surfaces of said second conductive element and said at least one annular packing have space therebetween.

* * * * *